(12) United States Patent
Cheng et al.

(10) Patent No.: US 8,341,967 B2
(45) Date of Patent: Jan. 1, 2013

(54) HEAT-DISSIPATING DEVICE FOR SUPPLYING COLD AIRFLOW

(75) Inventors: Chih-Hung Cheng, Wugu Township, Taipei County (TW); Ken Hsu, Wugu Township, Taipei County (TW); Chen-Hsiang Lin, Wugu Township, Taipei County (TW); Kuo-Len Lin, Wugu Township, Taipei County (TW)

(73) Assignees: Golden Sun News Techniques Co., Ltd., New Taipei (TW); Cpumate Inc., New Taipei (TW)

( * ) Notice: Subject to any disclaimer, the term of this patent is extended or adjusted under 35 U.S.C. 154(b) by 556 days.

(21) Appl. No.: 12/707,805

(22) Filed: Feb. 18, 2010

(65) Prior Publication Data

US 2011/0197598 A1  Aug. 18, 2011

(51) Int. Cl.
F25B 21/02 (2006.01)
(52) U.S. Cl. ........................................... 62/3.6
(58) Field of Classification Search .................. 62/3.2, 62/3.6, 3.7, 259.2; 165/104.34, 181
See application file for complete search history.

(56) References Cited

U.S. PATENT DOCUMENTS

| | | | |
|---|---|---|---|
| 2008/0105213 A1* | 5/2008 | Chen | 119/500 |
| 2008/0229758 A1* | 9/2008 | Lin et al. | 62/3.2 |
| 2009/0086171 A1* | 4/2009 | Sun | 353/52 |

FOREIGN PATENT DOCUMENTS

| | | |
|---|---|---|
| DE | 102006021829 A1 | 11/2007 |
| EP | 0127711 A1 | 12/1984 |
| WO | 0169694 A1 | 9/2001 |
| WO | 2005031992 A1 | 4/2005 |
| WO | 2009036542 A2 | 3/2009 |

OTHER PUBLICATIONS

Search Report.

* cited by examiner

Primary Examiner — Melvin Jones
(74) Attorney, Agent, or Firm — Chun-Ming Shih; HDLS IPR Services (57) ABSTRACT

A heat-dissipating device (1) includes a casing (10) and a thermal insulation plate (20) provided within the casing (10). The thermal insulating plate (20) divides the interior of the casing (10) into a first accommodating space (101) and a second accommodating space (102). A hot air outlet (121) and a first air inlet (122) of the casing (10) are in communication with the first accommodating space (101). A cold air outlet (110) and a second air inlet (123) of the casing (10) are in communication with the second accommodating space (102). A thermoelectric cooling chip (30) is disposed in a through-hole (200) of the thermal insulation plate (20) and has a hot-end surface (31) facing the first accommodating space (101) and a cold-end surface (32) facing the second accommodating space (102). A heat-dissipating module (40) is received in the first accommodating space (101). A cold-airflow supplying module (50) is received in the second accommodating space (102). The heat generated by the hot-end surface (31) is dissipated to the hot air outlet (121) by the thermal conduction of the heat-dissipating module (40). The cold generated by the cold-end surface (32) is conducted and distributed uniformly by the cold-airflow supplying module (50) to the cold air outlet (110).

15 Claims, 8 Drawing Sheets

HEAT-DISSIPATING DEVICE FOR SUPPLYING COLD AIRFLOW

BACKGROUND OF THE INVENTION

1. Field of the Invention

The present invention relates to a heat-dissipating device, and in particular to a heat-dissipating device having a thermoelectric cooling chip.

2. Description of Prior Art

Traditionally, a heat-dissipating device used in a high-power central processing unit includes: a heat sink directly mounted on the central processing unit, heat-dissipating fins provided above the central processing unit, heat pipes combined with the heat-dissipating fins, and a fan. The heat of the central processing unit is conducted to the heat pipes and the heat-dissipating fins. Finally, the fan generates airflow to dissipate the heat outside the computer.

With the increase of the operating speed of the central processing unit, the mount of heat generated by the central processing unit also raises to a much larger extent. Thus, it is necessary to develop a heat sink with increased heat-dissipating efficiency. Many manufacturers utilize a thermoelectric cooling chip in a heat-dissipating device, in which the cold generated by the thermoelectric cooling chip is used to reduce the temperature of an electronic system. However, since the temperature of the cold-end surface of the thermoelectric cooling chip is extremely low, frost will be generated on the cold-end surface to reduce the cold-generating capacity if the cold is not conducted to other places immediately. On the other hand, when the thermoelectric cooling chip is not in use and its temperature returns to the room temperature, due to the frost generated on the cold-end surface, droplets and steam are condensed on the cold-end surface, which will rust the electronic elements in the heat-dissipating device and deteriorate its electrical performance.

In view of the above problems, the present Inventor proposes a novel and reasonable structure based on his expert experience and deliberate researches.

SUMMARY OF THE INVENTION

The present invention is to provide a heat-dissipating device for supplying cold airflow, in which the cold generated by the cold-end surface of the thermoelectric cooling chip can be conducted to other places rapidly by a cold-airflow supplying module.

The present invention is to provide a heat-dissipating device for supplying cold airflow, which includes a casing, a thermal insulation plate, a thermoelectric cooling chip, a heat-dissipating module, and a cold-airflow supplying module. The casing is provided with a hot air outlet, a cold air outlet, a first air inlet, and a second air inlet. The thermal insulation plate is provided in the casing for dividing the interior of the casing into a first accommodating space and a second accommodating space. The hot air outlet and the first air inlet are in communication with the first accommodating space. The cold air outlet and the second air inlet are in communication with the second accommodating space. The thermal insulation plate is provided with a through-hole in which the thermoelectric cooling chip is disposed. The thermoelectric cooling chip has a hot-end surface facing the first accommodating space and a cold-end surface facing the second accommodating space. The heat-dissipating module is received in the first accommodating space, which comprises a thermal-conducting body adhered to the hot-end surface of the thermoelectric cooling chip, and a heat-dissipating fan positioned corresponding to the first air inlet. The cold-airflow supplying module is received in the second accommodating space to abut the cold-end surface of the thermoelectric cooling chip, which comprises a super heat pipe, a fins assembly connected to the super heat pipe, and a fan provided in the cold air outlet.

The present invention is to provide a heat-dissipating device for supplying cold airflow, which includes a casing, a thermal insulation plate, a thermoelectric cooling chip, a heat-dissipating module, and a cold-airflow supplying module. The casing is provided with a hot air outlet, a cold air outlet, and an air inlet. The thermal insulation plate is provided in the casing for dividing the interior of the casing into a first accommodating space and a second accommodating space. The hot air outlet is in communication with the first accommodating space. The cold air outlet and the air inlet are in communication with the second accommodating space. The thermal insulation plate is provided with a through-hole in which the thermoelectric cooling chip is disposed. A cold air inlet is formed between the thermal insulation plate and the casing. The thermoelectric cooling chip has a hot-end surface facing the first accommodating space and a cold-end surface facing the second accommodating space. The heat-dissipating module is received in the first accommodating space, which comprises a thermal-conducting body adhered to the hot-end surface of the thermoelectric cooling chip, and a heat-dissipating fan positioned corresponding to the cold air inlet. The cold-airflow supplying module is received in the second accommodating space to abut the cold-end surface of the thermoelectric cooling chip, which comprises a super heat pipe, a fins assembly connected to the super heat pipe, and a fan provided in the cold air outlet.

In comparison with prior art, according to the heat-dissipating device for supplying cold airflow of the present invention, the cold-end surface of the thermoelectric cooling chip is abutted by the cold-airflow supplying module comprising the super heat pipe, the fan and the fins assembly. The super heat pipe rapidly conducts the cold generated by the cold-end surface of the thermoelectric cooling chip to the fins assembly. Then, the cold is uniformly conducted to the respective fins by means of the large surface area of the fins assembly. Finally, the fan generates a cold airflow to the outside. Therefore, the cold generated by the cold-end surface of the thermoelectric cooling chip can be uniformly and immediately conducted to the outside via the cold air outlet by means of the cold-airflow supplying module. In this way, frost and droplets can be prevented from generating on the cold-end surface of the thermoelectric cooling chip, thereby protecting electronic elements from suffering damage. Therefore, the present invention demonstrates a better practicability and convenience.

DETAILED DESCRIPTION OF THE INVENTION

The characteristics and technical contents of the present invention will be described with reference to the accompanying drawings. However, the drawings are illustrative only, but not used to limit the present invention.

Figure 1:
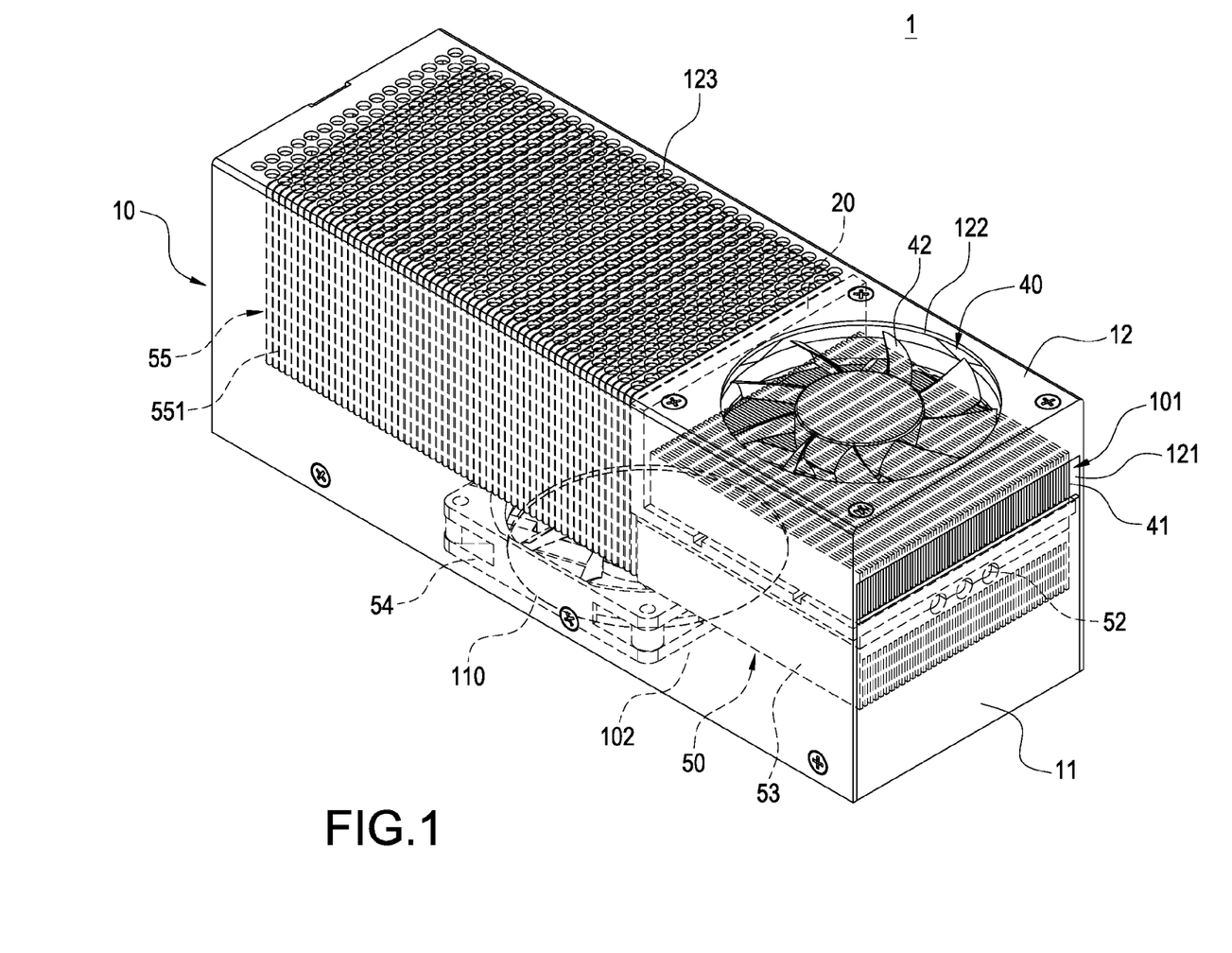
FIG. 1 is a perspective view showing the external appearance of the present invention.
Figure 2:
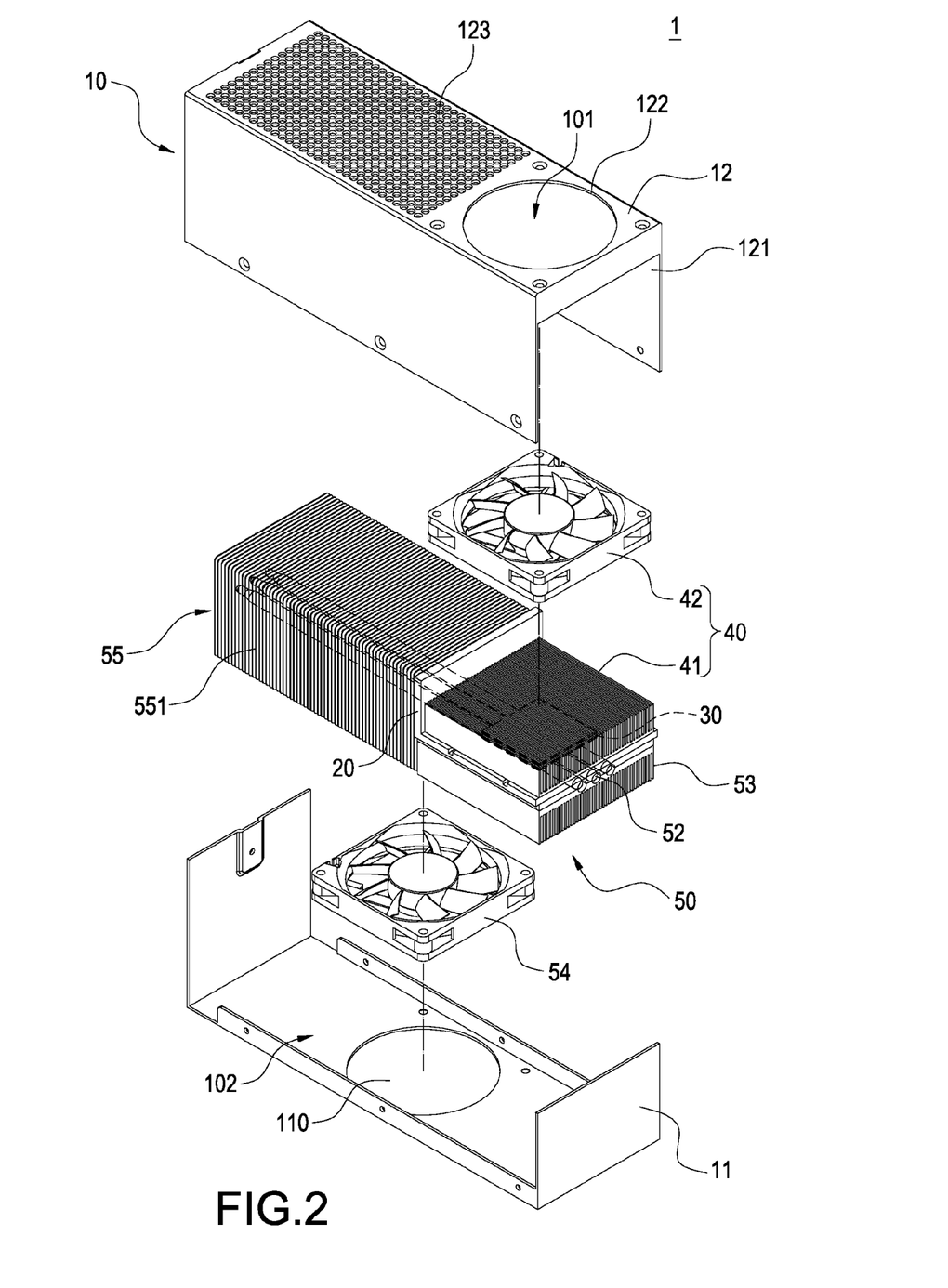
FIG. 2 is an exploded perspective view (I) of the present invention.
Figure 3:
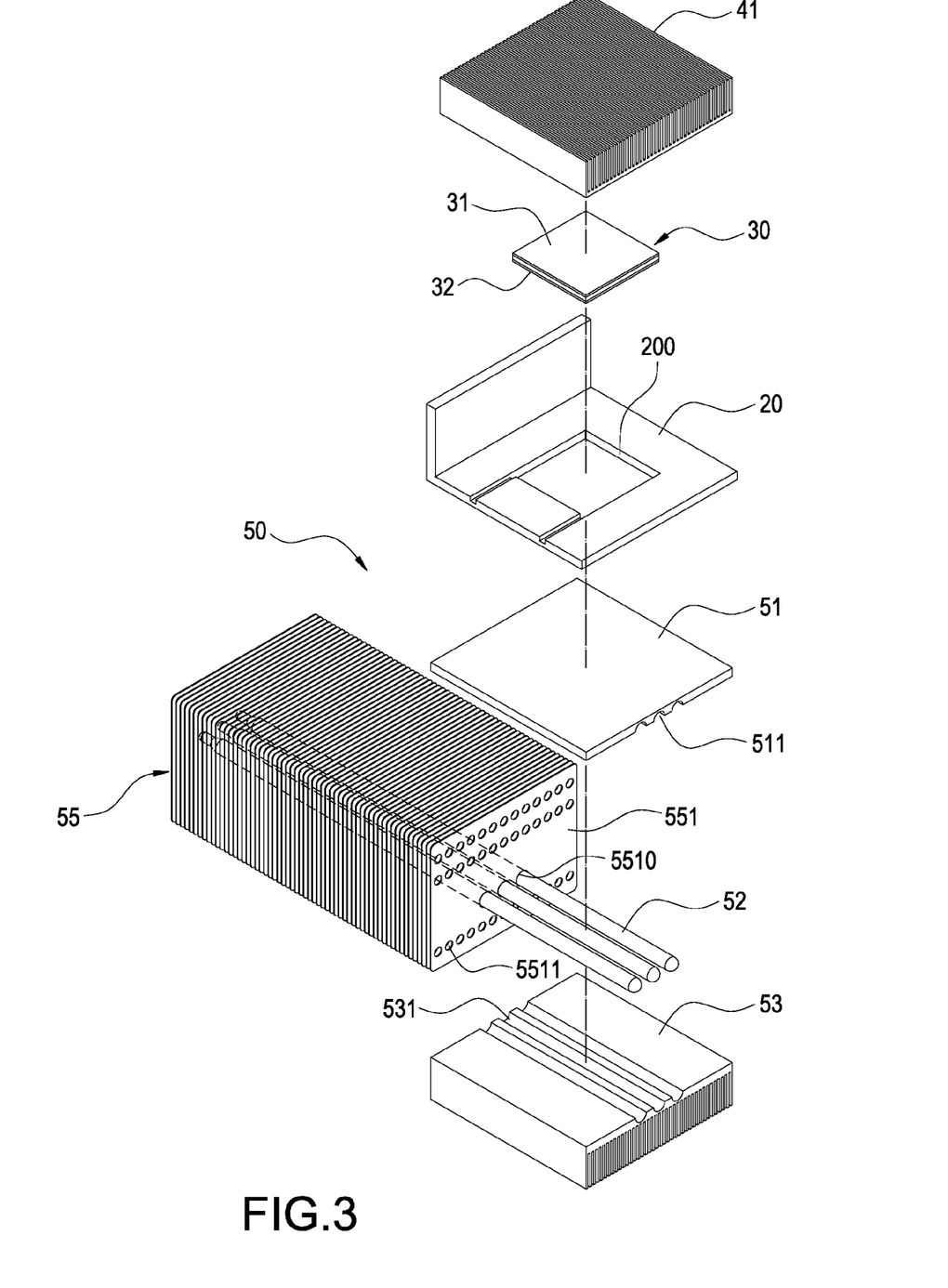
FIG. 3 is an exploded perspective view (II) of the present invention.
Figure 4:
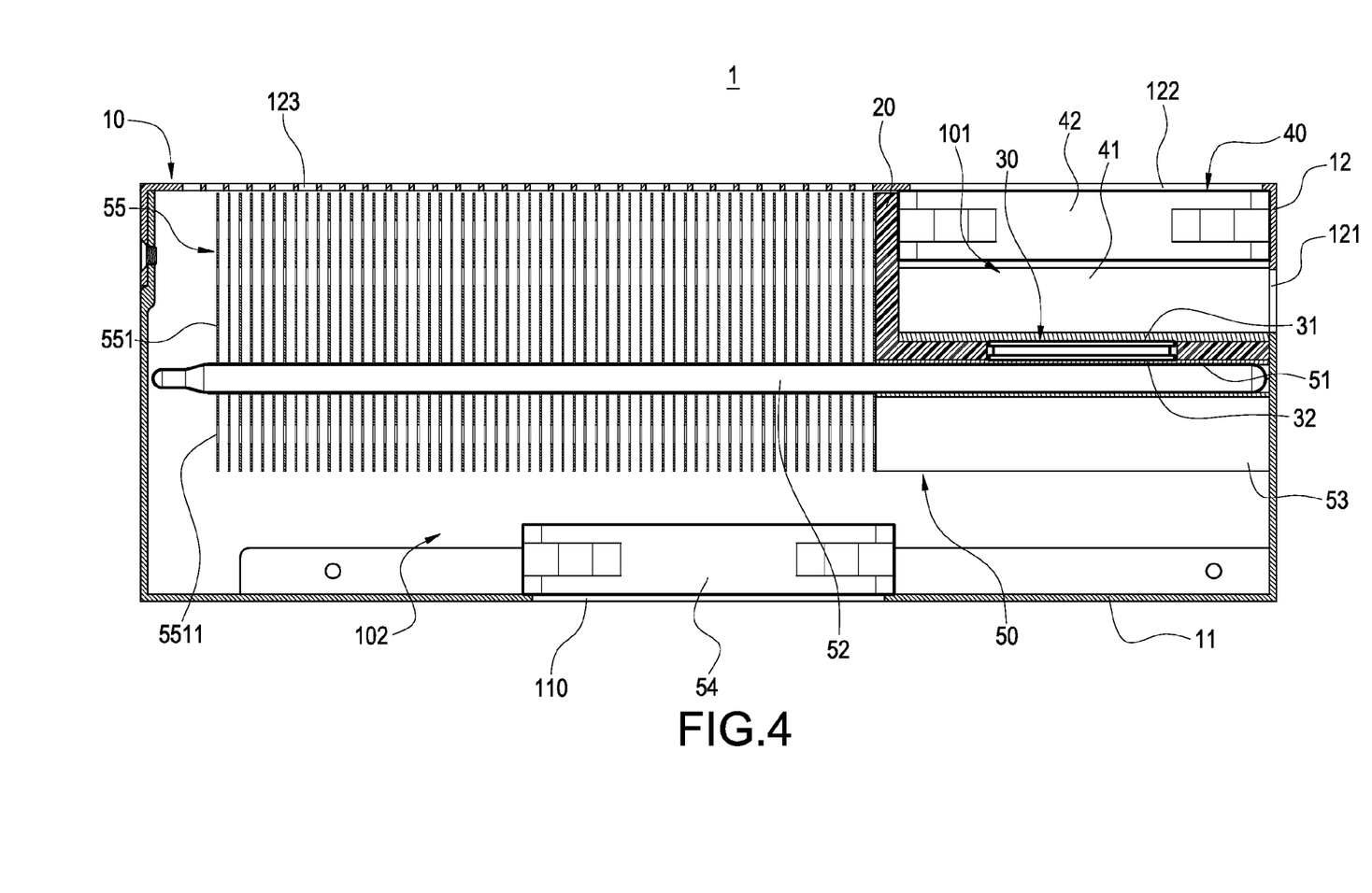
FIG. 4 is an assembled cross-sectional view of the present invention.

Please refer to FIGS. 1 and 4. FIG. 1 is a perspective view showing the external appearance of the present invention, FIG. 2 is an exploded perspective view (I) of the present invention, FIG. 3 is an exploded perspective view (II) of the present invention, and FIG. 4 is an assembled cross-sectional view of the present invention. The present invention provides a heat-dissipating device for supplying cold airflow, which includes a casing 10, a thermal insulation plate 20, a thermoelectric cooling chip 30, a heat-dissipating module 40, and a cold-airflow supplying module 50.

The casing 10 is constituted of a base 11 and an upper cover 12. The base 11 is provided with a cold air outlet 110. The upper cover 12 is provided with a hot air outlet 121, a first air inlet 122, and a second air inlet 123.

The cross section of the thermal insulation plate 20 is formed into an L shape. The thermal insulation plate 20 is provided in the casing 10 for dividing the interior of the casing 10 into a first accommodating space 101 and a second accommodating space 102. The hot air outlet 121 and the first air inlet 122 are in communication with the first accommodating space 101. The cold air outlet 110 and the second air inlet 123 are in communication with the second accommodating space 102. The second air inlet 123 is constituted of an array of holes arranged on the top surface of the upper cover 12. The thermal insulation plate 20 is further provided with a through-hole 200.

The thermoelectric cooling chip 30 is provided in the through-hole 200 of the thermal insulation plate 20. The thermoelectric cooling chip 30 has a hot-end surface 31 facing the first accommodating space 101 and a cold-end surface 32 facing the second accommodating space 102.

The heat-dissipating module 40 is received in the first accommodating space 101 and comprises a thermal-conducting body 41 and a heat-dissipating fan 42. The thermal-conducting body 41 is constituted of aluminum-extruded heat-dissipating fins abutting the hot-end surface 31 of the thermoelectric cooling chip 30. The heat-dissipating fan 42 is an axial fan fixed in the first air inlet 122. A distance is formed between the heat-dissipating fan 42 and the thermal-conducting body 41 to generating a better air-guiding effect.

The cold-airflow supplying module 50 is received in the second accommodating space 102 to abut the cold-end surface 32 of the thermoelectric cooling chip 30. The cold-airflow supplying module 50 comprises a cold-conducting plate 51, a super heat pipe 52, a set of secondary fins 53, a fan 54, and a fins assembly 55. The bottom surface of the cold-conducting plate 51 is provided with a groove 511 in which the super heat pipe 52 is fixed. That is, the cold-conducting plate 51 is sandwiched between the thermoelectric cooling chip 30 and the super heat pipe 52. The set of secondary fins 53 is also constituted of aluminum-extruded heat-dissipating fins with a trough 531 on its top surface. The super heat pipe 52 is received in the trough 531 in such a manner that the set of secondary fins 53 abuts one side of the super heat pipe 52. Further, the fan 54 is also an axial fan provided in the cold air outlet 110. The fins assembly 55 is connected to the super heat pipe 52. In the present embodiment, the fins assembly 55 is constituted of a plurality of fins 551 arranged in parallel. Each of the fins 551 is provided with a perforation 5510. The super heat pipe 52 penetrates the perforations 5510 of the fins 551. The fins 551 are provided with a plurality of venting holes 5511 for allowing air to flow through the respective fins 551. The venting holes 5511 are oriented to face the set of secondary fans 53.

Figure 5:
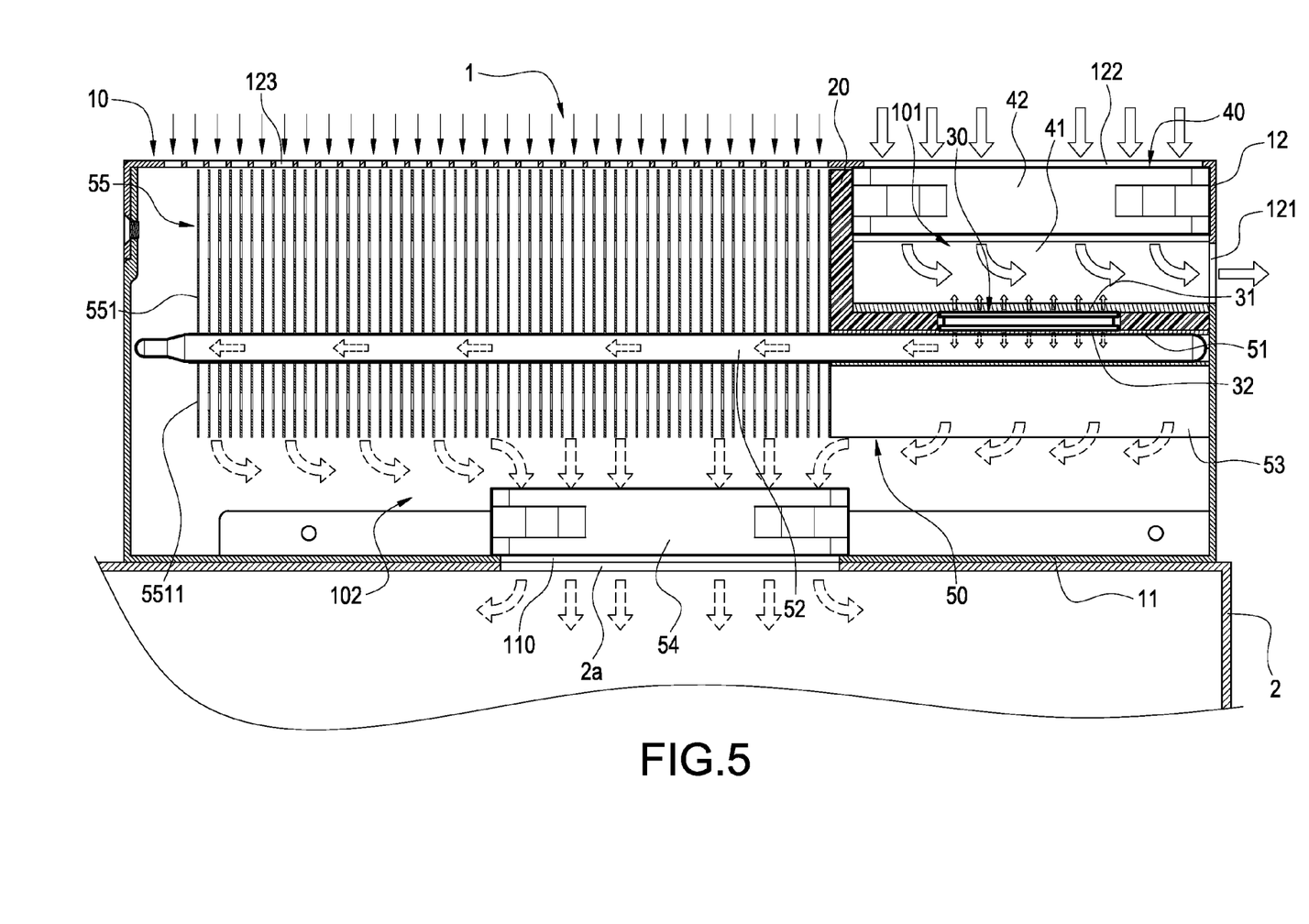
FIG. 5 is a schematic view showing an operating state of the present invention.

Please refer to FIG. 5, which is a schematic view showing an operating state of the present invention. In the present embodiment, the heat-dissipating device 1 is used for the heat dissipation of a computer housing 2. The computer housing 2 is provided with a cooling air inlet 2a. The heat-dissipating device 1 is mounted on the computer housing 2 in such a manner that the cold air outlet 110 of the heat-dissipating device 1 is aligned with the cooling air inlet 2a. In use, electricity is supplied to the thermoelectric cooling chip 30, the heat-dissipating fan 42 and the fan 54. The external cold air is introduced into the first accommodating space 101 and the second accommodating space 102 via the first air inlet 122 and the second air inlet 123 respectively. The heat generated by the hot-end surface 31 of the thermoelectric cooling chip 30 is conducted by the thermal-conducting body 41. The heat-dissipating fan 42 blows hot airflow to the outside via the hot air outlet 123. On the other hand, the cold generated by the cold-end surface 32 of the thermoelectric cooling chip 30 is conducted by the cold-conducting plate 51 to the super heat pipe 52. Then, the super heat pipe 52 rapidly conducts the cold to the set of secondary fins 53 and the fins assembly 55. In this way, the cold can be uniformly distributed on the set of secondary fins 53 and the fins assembly 55. The cold can be conducted to the second accommodating space 102 by means of the large area of the set of secondary fins 53 and the fins assembly 55. At this time, the airflow generated by the fan 54 forces the cold airflow in the second accommodating space 102 to flow out of the cold air outlet 110 of the base 11 and then enter the computer housing 2, thereby dissipating the heat of the computer housing 2.

Figure 6:
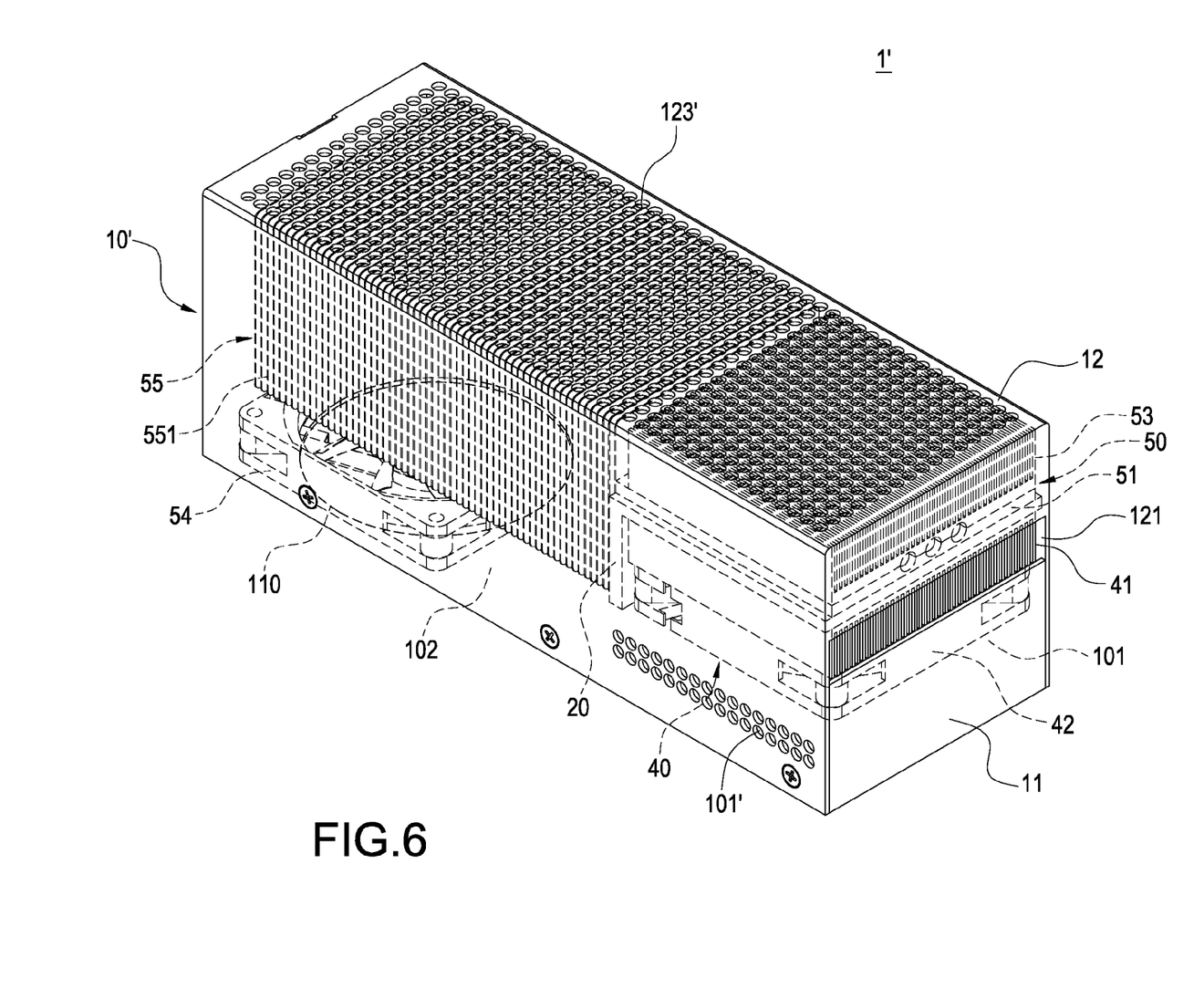
FIG. 6 is a perspective view showing the external appearance according to a second embodiment of the present invention.
Figure 7:
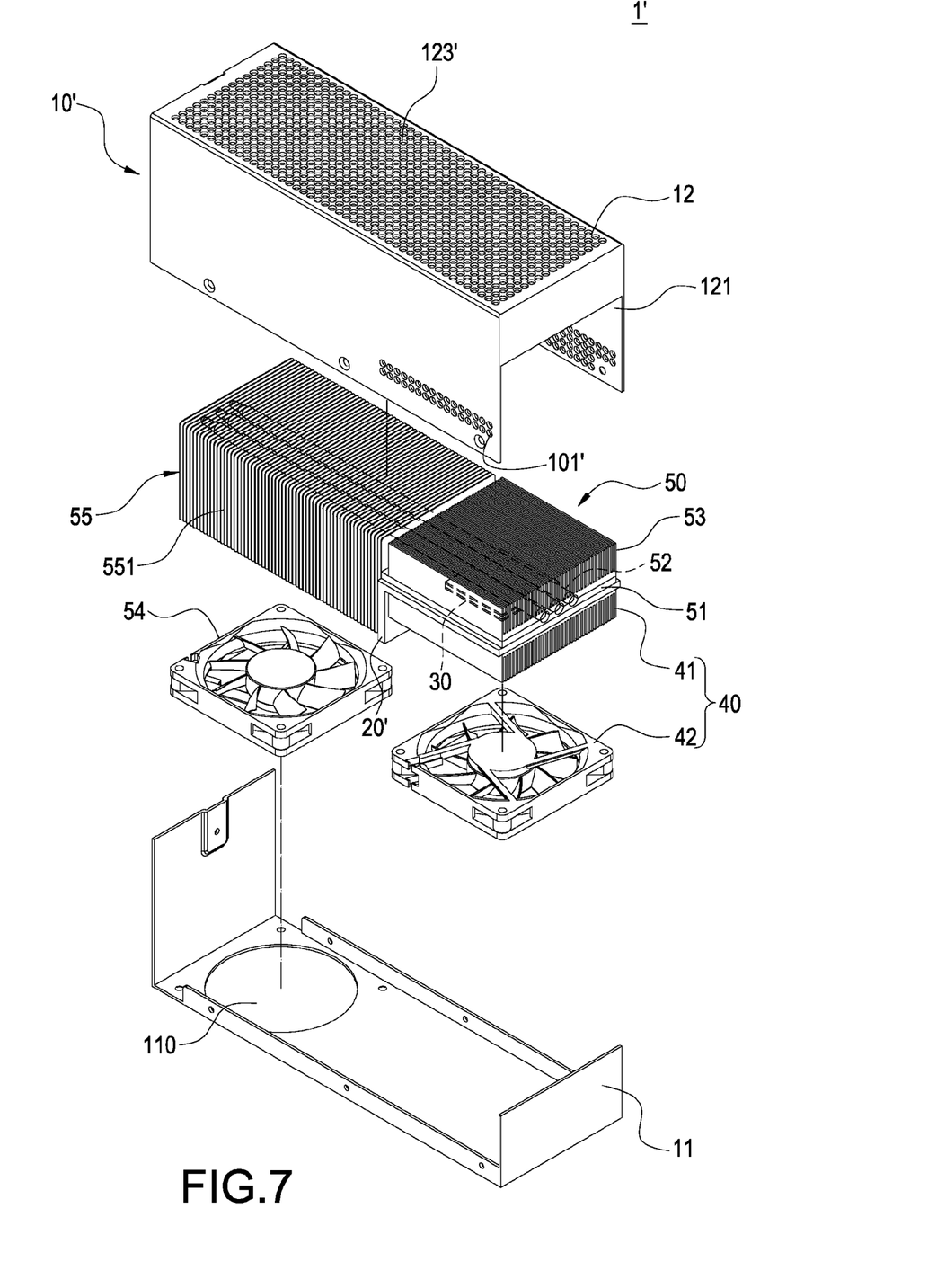
FIG. 7 is an exploded perspective view according to the second embodiment of the present invention.
Figure 8:
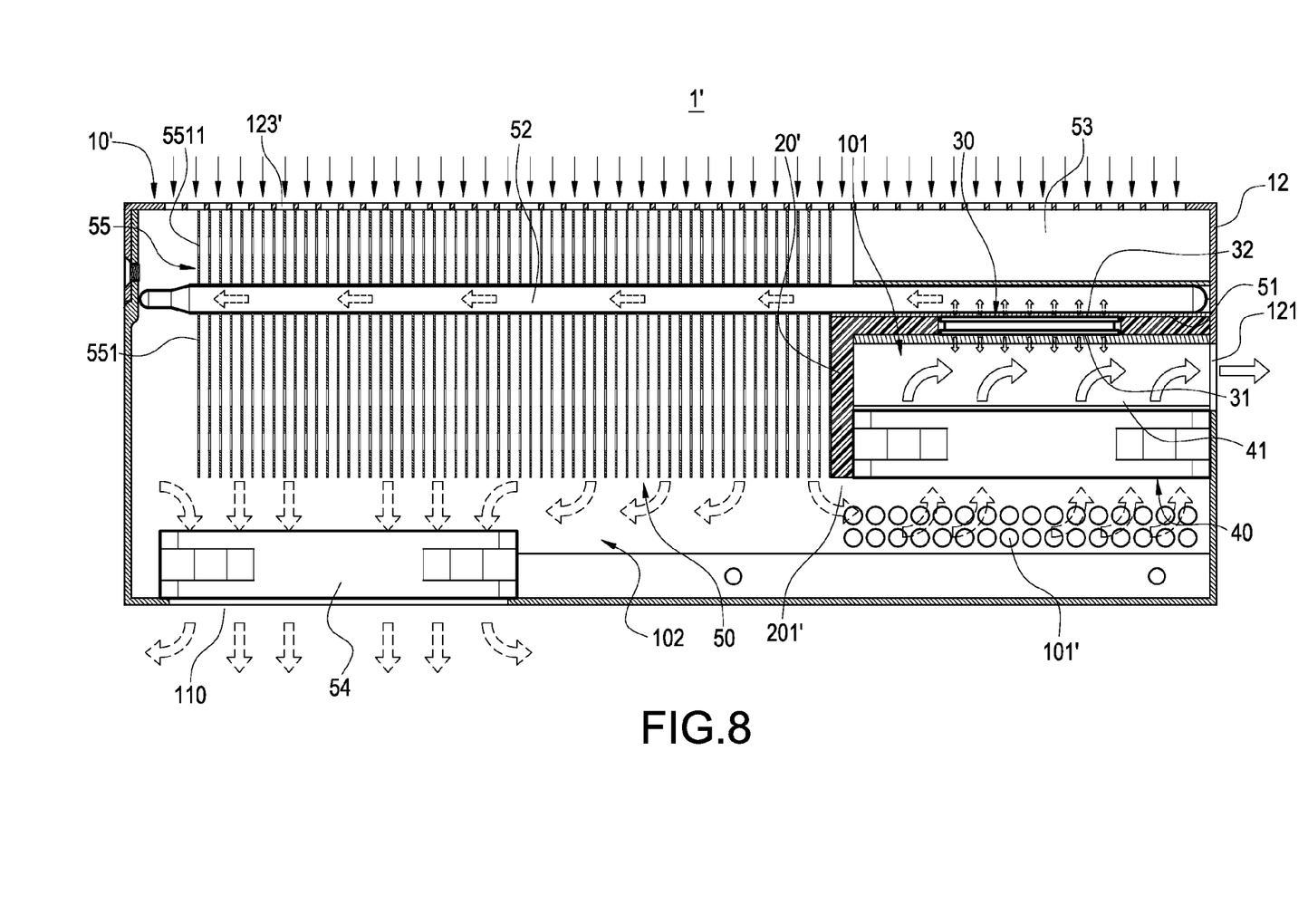
FIG. 8 is an assembled cross-sectional view according to the second embodiment of the present invention.

Please refer to FIGS. 6 to 8. FIG. 6 is a perspective view showing the external appearance according to a second embodiment of the present invention, FIG. 7 is an exploded perspective view according to the second embodiment of the present invention, and FIG. 8 is an assembled cross-sectional view according to the second embodiment of the present invention. The second embodiment of the present embodiment is substantially the same as the first embodiment. The difference between the second embodiment and the first embodiment lies in that a cold air inlet 201' is formed between the thermal insulation plate 20' of the heat-dissipating device 1' and the casing 10'. The cold air inlet 201' makes the first accommodating space 101 to be communicated with the second accommodating space 102. Thus, a portion of the cold air in the second accommodating space 103 may enter the first accommodating space 101 via the cold air inlet 201', thereby reducing the temperature of the first accommodating space 101 and facilitating the heat dissipation of the heat-dissipating module 40. The heat-dissipating fan 42 is fixed to one side of the thermal-conducting body 41. A distance is formed between the heat-dissipating fan 42 and the thermal-conducting body 41, thereby generating a better air-guiding effect. Further, the casing 10' is provided with an external air inlet 101' in communication with the first accommodating space 101 for supplying more external air to the heat-dissipating fan 42 for better heat dissipation. Further, in the present embodiment, the air inlet 123' of the casing 10' is identical to the second air inlet 123 in the first embodiment.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A heat-dissipating device for supplying cold airflow, including:
   a casing (10) provided with a hot air outlet (121), a cold air outlet (110), a first air inlet (122), and a second air inlet (123);
   a thermal insulation plate (20) provided in the casing (10) for dividing an interior of the casing (10) into a first accommodating space (101) and a second accommodating space (102), the hot air outlet (121) and the first air inlet (122) being in communication with the first accommodating space (101), the cold air outlet (110) and the second air inlet (123) being in communication with the second accommodating space (102), and the thermal insulation plate (20) being provided with a through-hole (200);
   a thermoelectric cooling chip (30) disposed in the through-hole (200), the thermoelectric cooling chip (30) having a hot-end surface (31) facing the first accommodating space (101) and a cold-end surface (32) facing the second accommodating space (102);
   a heat-dissipating module (40) received in the first accommodating space (101) and comprising a thermal-conducting body (41) adhered to the hot-end surface (31) of the thermoelectric cooling chip (30) and a heat-dissipating fan (42) positioned corresponding to the first air inlet (122); and
   a cold-airflow supplying module (50) received in the second accommodating space (102) to abut the cold-end surface (32) of the thermoelectric cooling chip (30), the cold-airflow supplying module (50) comprising a super heat pipe (52), a fins assembly (55) connected to the super heat pipe (52), and a fan (54) provided in the cold air outlet (110).

2. The heat-dissipating device for supplying cold airflow according to claim 1, wherein a cross section of the thermal insulation plate (20) is formed into an L shape.

3. The heat-dissipating device for supplying cold airflow according to claim 1, wherein the heat-dissipating fan (42) is fixed in the first air inlet (122) of the casing (10), and a distance is formed between the heat-dissipating fan (42) and the thermal-conducting body (41).

4. The heat-dissipating device for supplying cold airflow according to claim 1, wherein the cold-airflow supplying module (50) further includes a cold-conducting plate (51) sandwiched between the thermoelectric cooling chip (30) and the super heat pipe (52), and a bottom surface of the cold-conducting plate (51) is provided with a groove (511) for allowing the super heat pipe (52) to be fixed therein.

5. The heat-dissipating device for supplying cold airflow according to claim 1, wherein the cold-airflow supplying module (50) further includes a set of secondary fins (53), and the set of secondary fins (53) are adhered to one side of the super heat pipe (52).

6. The heat-dissipating device for supplying cold airflow according to claim 1, wherein the fins assembly (55) is constituted of a plurality of fins (551) arranged in parallel, each of the fins (551) is provided with a perforation (5510), and the super heat pipe (55) penetrates the perforation (5510).

7. The heat-dissipating device for supplying cold airflow according to claim 6, wherein each of the fins (551) is provided with a plurality of venting holes (5511), and the venting holes (5511) are oriented to face the set of secondary fins (53).

8. A heat-dissipating device for supplying cold airflow, including:
   a casing (10') provided with a hot air outlet (121), a cold air outlet (110), and an air inlet (123');
   a thermal insulation plate (20) provided in the casing (10') for dividing an interior of the casing (10) into a first accommodating space (101) and a second accommodating space (102), the hot air outlet (121) being in communication with the first accommodating space (101), the cold air outlet (110) and the air inlet (123') being in communication with the second accommodating space (102), the thermal insulation plate (20) being provided with a through-hole (200), and a cold air inlet (201') being formed between the thermal insulation plate (20) and the casing (10');
   a thermoelectric cooling chip (30) disposed in the through-hole (200), the thermoelectric cooling chip (30) having a hot-end surface (31) facing the first accommodating space (101) and a cold-end surface (32) facing the second accommodating space (102);
   a heat-dissipating module (40) received in the first accommodating space (101) and comprising a thermal-conducting body (41) adhered to the hot-end surface (31) of the thermoelectric cooling chip (30) and a heat-dissipating fan (42) positioned corresponding to the cold air inlet (201'); and
   a cold-airflow supplying module (50) received in the second accommodating space (102) to abut the cold-end surface (32) of the thermoelectric cooling chip (30), the cold-airflow supplying module (50) comprising a super heat pipe (52), a fins assembly (55) connected to the super heat pipe (52), and a fan (54) provided in the cold air outlet (110).

9. The heat-dissipating device for supplying cold airflow according to claim 8, wherein the casing (10') is further provided with an external air inlet (101'), and the external air inlet (101') is in communication with the first accommodating space (101).

10. The heat-dissipating device for supplying cold airflow according to claim 8, wherein a cross section of the thermal insulation plate (20) is formed into an L shape.

11. The heat-dissipating device for supplying cold airflow according to claim 8, wherein the heat-dissipating fan (42) is fixed on one side of the heat-conducting body (41), and a distance is formed between the heat-dissipating fan (42) and the thermal-conducting body (41).

12. The heat-dissipating device for supplying cold airflow according to claim 8, wherein the cold-airflow supplying module (50) further includes a cold-conducting plate (51) sandwiched between the thermoelectric cooling chip (30) and the super heat pipe (52), and a bottom surface of the cold-conducting plate (51) is provided with a groove (511) for allowing the super heat pipe (52) to be fixed therein.

13. The heat-dissipating device for supplying cold airflow according to claim 8, wherein the cold-airflow supplying module (50) further includes a set of secondary fins (53), the set of secondary fins (53) are adhered to one side of the super heat pipe (52).

14. The heat-dissipating device for supplying cold airflow according to claim 8, wherein the fins assembly (55) is constituted of a plurality of fins (551) arranged in parallel, each of the fins (551) is provided with a perforation (5510), and the super heat pipe (52) penetrates the perforation (5510).

15. The heat-dissipating device for supplying cold airflow according to claim 14, wherein each of the fins (551) is provided with a plurality of venting holes (5511), and the venting holes (5511) are oriented to face the set of secondary fins (53).

* * * * *